United States Patent
Hawkins et al.

(10) Patent No.: US 10,937,869 B2
(45) Date of Patent: Mar. 2, 2021

(54) SYSTEMS AND METHODS OF MASKING DURING HIGH-ENERGY IMPLANTATION WHEN FABRICATING WIDE BAND GAP SEMICONDUCTOR DEVICES

(71) Applicant: General Electric Company, Schenectady, NY (US)

(72) Inventors: William Gregg Hawkins, Niskayuna, NY (US); Reza Ghandi, Niskayuna, NY (US); Christopher Bauer, Niskayuna, NY (US); Shaoxin Lu, San Jose, CA (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 71 days.

(21) Appl. No.: 16/147,227

(22) Filed: Sep. 28, 2018

(65) Prior Publication Data

US 2020/0105879 A1    Apr. 2, 2020

(51) Int. Cl.
*H01L 29/16*    (2006.01)
*H01L 29/06*    (2006.01)
(Continued)

(52) U.S. Cl.
CPC .... *H01L 29/1608* (2013.01); *H01L 21/02529* (2013.01); *H01L 21/0465* (2013.01);
(Continued)

(58) Field of Classification Search
None
See application file for complete search history.

(56) References Cited

U.S. PATENT DOCUMENTS 6,054,352 A * 4/2000 Ueno ................ H01L 29/66068
                                                        438/268
6,444,528 B1   9/2002 Murphy
(Continued)

FOREIGN PATENT DOCUMENTS

CN    104576335 A    4/2015
JP    2003248293 A   9/2003
(Continued)

OTHER PUBLICATIONS

Baliga, "Silicon Carbide Power Devices", World Scientific Publishing, Section 10.1.3, pp. 267-270, 2005.
(Continued)

*Primary Examiner* — Raj R Gupta
(74) *Attorney, Agent, or Firm* — Fletcher Yoder, P.C.

(57) ABSTRACT

The subject matter disclosed herein relates to wide band gap semiconductor power devices and, more specifically, to high-energy implantation masks used in forming silicon carbide (SiC) power devices, such as charge balanced (CB) SiC power devices. An intermediate semiconductor device structure includes a SiC substrate layer having a first conductivity type and silicon carbide (SiC) epitaxial (epi) layer having the first conductivity type disposed on the SiC substrate layer. The intermediate device structure also includes a silicon high-energy implantation mask (SiHEIM) disposed directly on a first portion of the SiC epi layer and having a thickness between 5 micrometers (μm) and 20 μm. The SiHEIM is configured to block implantation of the first portion of the SiC epi layer during a high-energy implantation process having an implantation energy greater than 500 kiloelectron volts (keV).

16 Claims, 8 Drawing Sheets

(51) Int. Cl.
  *H01L 29/78* (2006.01)
  *H01L 21/306* (2006.01)
  *H01L 21/04* (2006.01)
  *H01L 21/02* (2006.01)
  *H01L 29/423* (2006.01)

(52) U.S. Cl.
  CPC ........ *H01L 21/306* (2013.01); *H01L 29/0634* (2013.01); *H01L 29/4236* (2013.01); *H01L 29/7813* (2013.01)

(56) References Cited

U.S. PATENT DOCUMENTS

| | | | |
|---|---|---|---|
| 7,012,005 | B2 | 3/2006 | Lichtenberger et al. |
| 7,768,066 | B2 | 8/2010 | Onose et al. |
| 8,105,927 | B2 | 1/2012 | Nonaka et al. |
| 8,258,052 | B2 | 9/2012 | Okuno et al. |
| 8,357,971 | B2 | 1/2013 | Peake et al. |
| 9,704,949 | B1 | 7/2017 | Ghandi et al. |
| 9,735,237 | B2 | 8/2017 | Losee et al. |
| 9,768,259 | B2 | 9/2017 | Suvorov et al. |
| 9,893,176 | B2 | 2/2018 | Konstantinov |
| 2006/0051936 | A1* | 3/2006 | Koike ............... G03F 1/20 438/459 |
| 2006/0276014 | A1* | 12/2006 | Hsu ............ H01L 27/14601 438/526 |
| 2008/0014693 | A1 | 1/2008 | Matocha |
| 2010/0308400 | A1 | 12/2010 | Darwish et al. |
| 2012/0315746 | A1 | 12/2012 | Yamada et al. |
| 2014/0242787 | A1 | 8/2014 | Fujiwara et al. |
| 2016/0218187 | A1* | 7/2016 | Mochizuki ......... H01L 29/1608 |
| 2017/0278924 | A1 | 9/2017 | Bolotnikov et al. |
| 2018/0166531 | A1* | 6/2018 | Bolotnikov ....... H01L 21/26546 |
| 2019/0088479 | A1* | 3/2019 | Bolotnikov ......... H01L 29/0634 |

FOREIGN PATENT DOCUMENTS

| | | |
|---|---|---|
| KR | 1020130125530 B1 | 9/2013 |
| WO | 2017115633 A1 | 7/2017 |

OTHER PUBLICATIONS

Rohm Co., Ltd., "New Products Under Development 3rd Geb SiC MOSFET", 2014, 10 pages.

Holland, O.W., et al.; "A Method to Improve Activation of Implanted Dopants in SiC", vol. 650 (Symposium R—Microstructural Processes in Irradiated Materials—2000), Mar. 21, 2011.

Wang, Shou Guo; "Fabrication and Characteristics of Ion-implanted 4H Silicon Carbide Metal-Semiconductor Field-Effect Transistors on a P-Type Epilayer", Chinese Journal of Physics, vol. 51, Issue: 2, Apr. 2013.

Peters et al., "Performance and Ruggedness of 1200V Sic—Trench—MOSFET", 29th International Symposium on Power Semiconductor Devices and IC's (ISPSD), Jul. 24, 2017, 4 pages.

Oraon, Alisha, et al.; "A double trench 4H—SiC MOSFET as an enhanced model of SiC UMOSFET", 2017 7th International Symposium on Embedded Computing and System Design (ISED), Durgapur, India, pp. 1-5, Dec. 2017.

Bharti, Deepsikha, et al.; "Optimization of SiC UMOSFET Structure for Improvement of Breakdown Voltage and ON-Resistance", IEEE Transactions on Electron Devices, vol. 65, Issue: 2, pp. 615-621, Feb. 2018.

PCT/US2019/052487; International Search Report and Written Opinion dated Jan. 10, 2020; 12 pages.

* cited by examiner ically, to
SYSTEMS AND METHODS OF MASKING DURING HIGH-ENERGY IMPLANTATION WHEN FABRICATING WIDE BAND GAP SEMICONDUCTOR DEVICES

BACKGROUND

The subject matter disclosed herein relates to wide band gap semiconductor power devices and, more specifically, to high-energy implantation masks used in forming silicon carbide (SiC) power devices, such as charge balanced (CB) SiC power devices.

For semiconductor power devices, charge balance (CB) designs offer several advantages. For example, CB devices demonstrate reduced resistance and reduced conduction losses per unit area relative to traditional unipolar device designs. However, these CB designs, as well as other semiconductor power device designs, may include deeply implanted regions that can extend several micrometers through one or more semiconductor layers of the device. The diffusion coefficient of dopants into certain semiconductor materials, such as SiC, is relatively low compared to other semiconductor materials, such as silicon. As such, when a SiC CB device is being fabricated, high-energy ion implantation techniques may be used to achieve one or more deeply implanted regions. To use high-energy implantation to fabricate such features, a suitable masking material should be selected. However, it is presently recognized that conventional masking materials are ill-suited for use in high-energy implantations.

For example, organic materials typically used as masking materials for lower-energy implantation operations (e.g., below 500 kiloelectron volts (KeV)) include photoresists, polyimide, and other related materials. However, using an organic mask (also referred to as a soft mask) for a high-energy implantation operation would involve applying a substantially thick layer (e.g., 20 micrometers (μm) or more) of organic materials that is difficult to effectively pattern to desired high-resolution structures. These organic masking materials also degrade when exposed to an ion beam of the high-energy implantation device and, as such, are not considered dimensionally stable for high-energy implantation. Additionally, it is noted that organic materials typically do not survive being heated to temperatures above 300 degrees Celsius (° C.), which may occur during some types of high-energy implantation. Furthermore, organic masking materials can be difficult to remove after implantation is complete, leaving behind an undesirable residue that can affect the performance of the resulting device.

Silicon dioxide ($SiO_2$) is an example of a hard masking material that is also poorly suited for high-energy implantation processes. In particular, $SiO_2$ can be a challenging material to grow or etch at the thicknesses that would be used to block high-energy implantation. For example, since a formation rate associated with silicon dioxide is low, forming silicon dioxide layers thicker than approximately 2 μm is difficult. In addition, thicker layers of $SiO_2$ tend to develop stress while being deposited. When attempting to pattern the material after formation, $SiO_2$ is also difficult to etch to a depth over a few micrometers, which can result in residual portions of a $SiO_2$ mask remaining and undesirably blocking dopant from reaching intended portions of the underlying layer. For example, to pattern a $SiO_2$ layer in a mask, an organic photoresist mask may be used to protect portions of the $SiO_2$ layer from an etching process. During this etching process, part or all of the photoresist mask may decompose or etch before the $SiO_2$ is suitably etched to form the $SiO_2$ mask, resulting in undesirable irregularities in the patterning of the $SiO_2$ mask and/or the implantation of the underlying semiconductor layer.

Other hard masks, such as metal masks (e.g., nickel, gold, copper), also present issues when used for high-energy implantation. For example, it is difficult to deposit metal layers more than a few micrometers thick by evaporation or sputtering without creating high-stress and/or delamination within the intermediate device structure. In addition, etching metal layers more than a few micrometers thick can be difficult. Further, it is noted that, when metal layers are used for masking, residual metal that is not removed after implantation can be driven into the semiconductor device during subsequent thermal processing, such as a thermal oxidation step during the fabrication of a semiconductor device. As such, while metal masking materials can overcome some of the limitations of organic masking materials, using metal masks can result in undesirable entrapment of metal atoms within the semiconductor structure of the power device, which can lead to unpredictability and/or failures (e.g., shorts) in the resulting semiconductor power device. In addition to potentially interfering with device operation, residual metal from a metal mask can also undesirably deposit within fabrication equipment (e.g., implantation chambers, furnaces), contaminating and/or potentially interfering with the normal operation of the equipment.

BRIEF DESCRIPTION

In one embodiment, an intermediate semiconductor device structure includes a SiC substrate layer having a first conductivity type and silicon carbide (SiC) epitaxial (epi) layer having the first or second conductivity type disposed on the SiC substrate layer. The intermediate device structure also includes a silicon high-energy implantation mask (SiHEIM) disposed directly on a first portion of the SiC epi layer and having a thickness between 5 micrometers (μall) and 20 μm. The SiHEIM is configured to block implantation of the first portion of the SiC epi layer during a high-energy implantation process having an implantation energy greater than 500 kiloelectron volts (keV).

In another embodiment, a method, includes: forming a silicon carbide (SiC) epitaxial (epi) layer on a SiC semiconductor layer; disposing a polysilicon mask layer on the SiC epi layer; patterning the polysilicon mask layer to yield a high-energy implantation silicon mask (SiHEIM) directly on a first portion of the SiC epi layer; and performing high-energy implantation of the SiC layer to form a high-energy implanted region in the SiC epi layer, wherein the high-energy implanted region has a depth between 5 μm and 10 μm.

In another embodiment, an intermediate semiconductor device structure includes a SiC substrate layer having a first conductivity type, a silicon carbide (SiC) epitaxial (epi) layer having the first or second conductivity type disposed on the SiC substrate layer, and a silicon high-energy implantation mask (SiHEIM) disposed directly on a first portion of the SiC epi layer. The intermediate semiconductor device structure also includes a high-energy implanted region having a second conductivity type disposed in a second portion the SiC epi layer exposed by the SiHEIM, wherein the high-energy implanted region has a depth between 2 micrometers (μ) and 15 μm.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
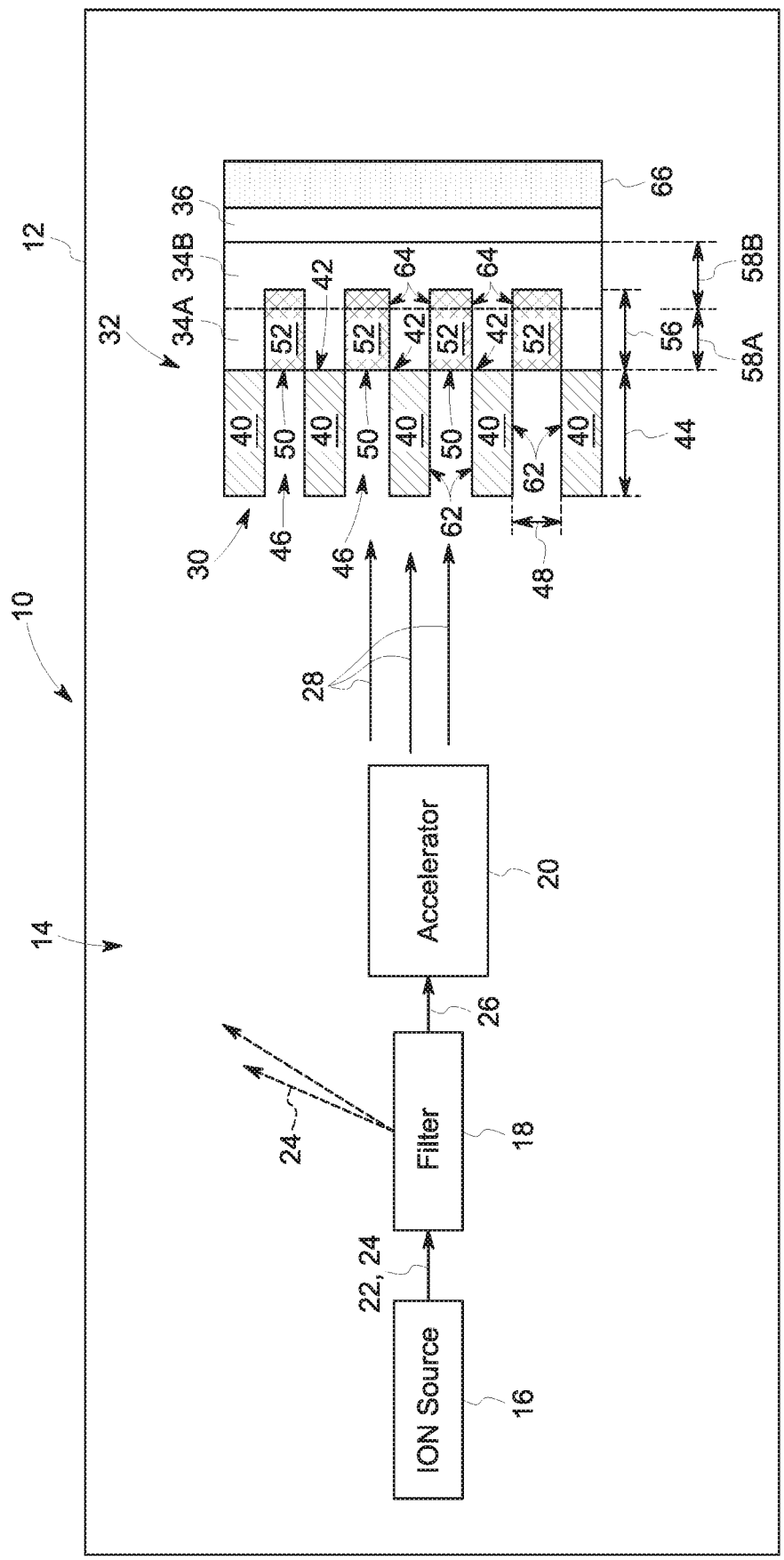
FIG. 1 is a schematic diagram of a high-energy implantation system performing a high-energy implantation process on an intermediate semiconductor device structure that includes a silicon high-energy mask (SiHEIM), in accordance with embodiments of the present approach.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or multiple of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers are directly in contact with each other with no intervening layers there between. The term "adjacent" as used herein means that the two layers are disposed contiguously and are in direct contact with each other.

In the present disclosure, when a layer/region is described as "on" another layer or substrate, it is to be understood that the layers/regions may either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer.

As discussed below, the disclosed semiconductor devices may include multi-layered drift regions implemented using repeated epitaxial growth and dopant implantation steps. As used herein, the term "multi-layered," as well as references to a particular number of layers (e.g., "two-layered," "three-layered," "four-layered,"), refers to the number of epitaxial (epi) layers of the semiconductor device. It may be appreciated that, of the epi layers, the top epi layer is referred to herein as a device layer, while one or more of the underlying epi layers are referred to herein as charge balance (CB) layers.

Present embodiments are directed toward designs and methods of manufacturing semiconductor devices, such as semiconductor charge-balance (CB) devices or semiconductor super-junction (SJ) devices. The disclosed designs and methods are useful in the manufacture of CB devices, such as vertical CB trench metal-oxide-semiconductor field-effect transistor (MOSFET) devices, as well as other devices that may be useful for medium-voltage (e.g., 2 kV-10 kV) and high-voltage (e.g., greater than or equal to 10 kV or 10 kV-20 kV) power conversion related applications. While discussed in the context of a vertical CB trench-MOSFET device below, it may be appreciated that the disclosed technique may be applicable to other suitable types of semiconductor devices, such as a metal-oxide-semiconductor field-effect transistor (MOSFET), a junction field effect transistor (JFET), a bipolar junction transistor (BJTs), and/or diodes. Additionally, while discussed below in the context of implanting silicon carbide (SiC) layer, the disclosed methods may be useful when performing high-energy implantation processes on other semiconductor materials, such as silicon, gallium nitride, diamond, aluminum nitride, boron nitride, or other suitable semiconductor materials.

As mentioned, during fabrication of a semiconductor device, deep ion implantation may be performed to define one or more features (e.g., charge balance regions, charge balance bus regions, super-junction pillars) in one or more semiconductor layers of an intermediate device structure. High-energy ion implantation (also referred to herein as high-energy implantation) enables dopants to penetrate a substantial depth (e.g., several micrometers) into certain types semiconductor layers, including those with low dopant diffusion (e.g., SiC). As used herein, "high-energy" refers to implantation operations having energies greater than 500 kiloelectron volts (keV), such as between 10 megaelectron volts (MeV) and 50 MeV. For example, high-energy implantation enables dopants to penetrate greater than 1 µm (e.g., between 2 µm and 15 µm, between 5 µm and 10 µm) into SiC epi layers. However, high-energy implantation poses a particular challenge when designing masks capable of effectively blocking dopants from reaching certain regions of the intermediate device structure during implantation. More specifically, it is presently recognized that a high-energy implantation mask should be able to be controllably formed to suitable thickness, should be substantially stable (e.g., thermally stable, chemically stable) to the conditions of the high-energy implantation process, should have similar thermal expansion properties relative to the underlying layer, and should be able to be reliably patterned into well-defined, high-aspect ratio features (e.g., trench features having substantially vertical sidewalls).

With the preceding in mind, present embodiments are directed toward high-energy implantation masks suitable for use in high-energy implantation operations in the fabrication of semiconductor devices (e.g., SiC semiconductor power devices). In particular, present embodiments include a silicon high-energy implantation mask (SiHIEM) designed to effectively block a high-energy implantation process from doping portions of an underlying SiC layer during the fabrication of a SiC power device. As discussed below, to fabricate the disclosed SiHEIM, a polysilicon mask layer first is formed (e.g., grown, deposited, bonded) on an underlying SiC layer at a suitable thickness (e.g., between 5 µm and 20 µm). Subsequently, the polysilicon mask layer is patterned using traditional Si fabrication techniques (e.g., photolithography, dry etching) to selectively expose or unmask portions of the SiC layer for high-energy implantation. Using established silicon fabrication technology to precisely form and pattern the polysilicon mask layer, the resulting SiHEIM includes high-aspect ratio trench features (e.g., between 5 µm and 20 µm deep and between 1 µm and 10 µm wide) that have substantially vertical sidewalls and that facilitate the implantation of well-defined, deeply implanted regions in the underlying SiC layer.

Additionally, in terms of thermal properties, it is presently recognized that the disclosed SiHEIM has a similar coefficient of thermal expansion relative to SiC, which prevents or mitigates delamination between the SiHEIM and the SiC layer despite temperature changes (e.g., heating/cooling cycles) during device fabrication. The disclosed SiHEIM is also thermal stable (e.g., above 500° C., above 1000° C.) and is not substantially degraded by the high-energy implantation process. Unlike organic masks, the SiHEIM mask can effectively mask the underlying SiC layer while remaining relatively thin (e.g., 20 µm or less) and is cleanly removed after implantation using established silicon etching techniques. Furthermore, unlike metal masks, the disclosed SiHEIM avoids the risk of undesirable metal contamination of the semiconductor device and/or the fabrication equipment, improving the reliability of the resulting semiconductor device and/or the fabrication equipment. As such, the disclosed SiHEIM enables effective masking of a SiC layer during one or more high-energy implantation operations as part of the fabrication of a SiC semiconductor device.

With the foregoing in mind, FIG. 1 is a schematic diagram of an example embodiment of a high-energy implantation system 10, in accordance with the present technique. As mentioned, the illustrated high-energy implantation system 10 is designed to perform high-energy implantation processes at energies greater than 500 kiloelectron volts (keV) (e.g., between 10 megaelectron volts (MeV) and 50 MeV). Additionally, the high-energy implantation system 10 is capable of implanting a number of different suitable dopant ions (e.g., boron, nitrogen, phosphorus, aluminum, arsenic) at these energies to form doped semiconductor regions having a first conductivity type (e.g., n-type) or a second conductivity type (e.g., p-type) that extend deeply into the semiconductor surface (e.g., to a depth greater than 2 µm, between 2 µm and 15 µm).

As depicted in FIG. 1, the high-energy implantation system 10 includes an implantation chamber 12, which defines an interior volume 14 that is generally maintained under vacuum during the implantation process. A number of components of the high-energy implantation system 10 are disposed within the implantation chamber 12, including an ion source 16, a filter 18, and an accelerator 20, which are discussed in greater detail below. It may be appreciated that the high-energy implantation system 10 of FIG. 1 is a simplified embodiment with certain components illustrated to generally facilitate discussion of the operation of the system 10. As such, it should be noted that embodiments of the high-energy implantation system 10 may include additional or different components (e.g., vacuum pumps, controllers, sensors, and so forth) to enable operation of the high-energy implantation system 10, in accordance with the present disclosure.

During operation of the illustrated embodiment of the high-energy implantation system 10, the ion source 16 generates ions 22, which include ions of the desired dopant atom (e.g., boron, nitrogen, phosphorus, aluminum, arsenic). However, in certain cases, when ions 22 are generated by the ion source 16, side product ions 24 that are distinct from desired dopant ions 26 may also be generated. In such embodiments, the filter 18 of the high-energy implantation system 10 facilitates separation and removal of undesired ions 24, such that only the filtered ions 26 of the desired dopant atoms advance to the next stage in the system (e.g., the accelerator 20). Any suitable type of filter 18 or filtering technique may be used, such as a separation magnet, a physical filter, a mass spectrometer, or the like, in accordance with the present disclosure.

The filtered dopant ions 26 are subsequently directed to the accelerator 20, which accelerates the dopant ions to the desired implantation energy (e.g., greater than 500 keV, between 10 MeV and 50 MeV), forming one or more high-energy ion beams 28 that are directed toward an upper surface 30 of an intermediate device structure 32. It should be understood that a combination of the nature of the dopant ions, the nature of intermediate device structure 32, and the implantation energy dictates the penetration depth, or the range of how deeply the ion implants into the intermediate device structure 32. For example, a suitable magnetic field may be generated within the accelerator 20 to accelerate ions to suitable energies for implantation. In some embodiments, there may also be one or more components (e.g., a set of plates) disposed between the accelerator 20 and the intermediate device structure 32, and these components may be used to direct or scan the ion beams 28 in one or more dimensions over the upper surface 30 of the intermediate device structure 32 to achieve homogenous implantation.

After leaving the accelerator 20, the ion beams 28 impinge upon the upper surfaces 30 and selectively implant in portions of one or more epi layers 34 of the intermediate device structure 32. For the illustrated example, the intermediate device structure 32 includes a top or device epi layer 34A disposed directly on a second or buried epi layer 34B, which is, in turn, disposed directly on a substrate layer 36.

For example, epi layers 34A and 34B and the substrate layer 36 may be SiC layers, and the intermediate device structure 32 may be that of a SiC power FET device.

As mentioned, for present embodiments, a SiHEIM 40 is disposed on the device epi layer 34A and forms a portion of the upper surface 30 of the intermediate device structure 32. The SiHEIM 40 effectively blocks the ion beams 28 from reaching and doping masked regions 42 of the epi layers 34. It may be appreciated that the SiHEIM 40 is formed (e.g., grown, deposited, bonded) to have a sufficient thickness 44 to block or prevent the underlying portions of the intermediate device structure 32 from receiving the implantation dose.

For example, in certain embodiments, the SiHEIM 40 may have a thickness 44 between 1 μm and 20 μm (e.g., between 5 μm and 20 μm). The SiHEIM 40 includes a number of well-defined, high-aspect ratio trench features 46, each having a respective width 48 between 1 μm and 10 μm, and each extending through the entire thickness 44 of the SiHEIM 40 to selectively expose regions 50 of the underlying epi layers 34 for implantation. As such, the epi layers 34 of the illustrated intermediate device structure 32 include high-energy implanted regions 52 disposed directly below the exposed or unmasked regions 50 of the epi layers 34. The high-energy implanted regions 52 each have a respective width that is substantially similar to the width 48 of the corresponding high-aspect ratio trench features 46. The high-energy implanted regions 52 each have a depth 56, which, for the illustrated embodiment, extends through an entire thickness 58A of the epi layer 34A and into a portion of the thickness 58B of the epi layer 34B. Additionally, it should be noted that the trench features 46 of the SiHEIM 40 include edges 62 that are patterned to be substantially vertical (e.g., substantially perpendicular to the epi layers 34 of the intermediate device structure 32). As such, the high-energy implanted regions 52 may also be described as having substantially vertical edges 64 (e.g., substantially perpendicular to a surface of the epi layer 34A).

In some embodiments, the intermediate device structure 32 may be heated during the high-energy implantation process. For example, the illustrated high-energy implantation system 10 includes a heat source 66, which may be integrated into a stage or platform onto which the intermediate device structure 32 is mounted during the implantation process. In some embodiments, the heat source 66 is not in direct contact with the substrate layer 36 but instead in close proximity to the wafer. It is presently recognized that heating the intermediate device structure 32 (e.g., to temperatures between 100° C. and 1000° C.) during certain high-energy implantation processes can repair (e.g., anneal) damage potentially introduced by the high-energy implantation process as it occurs. Also, high temperature ion implantation can avoid amorphization of the substrate layer 36 when implanted to high doses. As mentioned, the disclosed SiHEIM 40 is thermally stable (e.g., at temperatures between 100° C. and 1000° C., or even above 1000° C.) and chemically stable to (e.g., does not substantially degrade) the high-energy ion beams 28.

In additional to thermal and chemical stability, the SiHEIM 40 offers additional advantages over other masking materials and techniques. In particular, in certain embodiments, the disclosed SiHEIM 40 can be formed with a high purity and consist essentially of silicon. For example, a contaminant concentration of a typical epi layer may be $10^{12}$ per cubic centimeters ($cm^{-3}$), while, in certain embodiments, the contaminant concentrations of the SiHEIM 40 may be tightly controlled. The cleanliness of the SiHEIM 40 is beneficial from the standpoint of limiting unwanted contamination of the intermediate device structure 32 or the implantation chamber 12. That is, during the implantation process, ions impacting the intermediate device structure 32 can cause limited portions of the SiHEIM 40 to be displaced and to diffuse within the chamber 10. In some circumstances, the displaced material may deposit within the implantation chamber 12, while in other circumstances, the material is accelerated and is unintentionally implanted along with the dopant ions within the epi layers 34 of the intermediate device structure 32.

However, for embodiments in which the SiHEIM 40 is exceedingly pure, it is presently appreciated that the displaced material is unlikely to include contaminant species (e.g., metal atoms or ions) that could potentially interfere with the operation of the high-energy implantation system 10 or a semiconductor device fabricated using the implanted intermediate device structure 32. Additionally, it is presently recognized that, if a small amount of silicon from the SiHEIM 40 becomes implanted into the underlying SiC layer, this will not significantly affect the electrical properties of the intermediate device structure 32 or of the resulting semiconductor device. Also, since silicon is a common material in semiconductor manufacturing, silicon displaced from the SiHEIM 40 during implantation and/or released from the underlying SiC layer during subsequent thermal processing is generally not an issue or concern for the semiconductor device or the fabrication equipment. As mentioned, this is in sharp contrast to metal masking techniques, in which even a small amount of displaced metal can cause undesirable side-effects during manufacturing (e.g., contaminating implantation chambers and/or furnaces during fabrication) as well as during device operation (e.g., unpredictable behavior, shorting device terminals).

Figure 2:
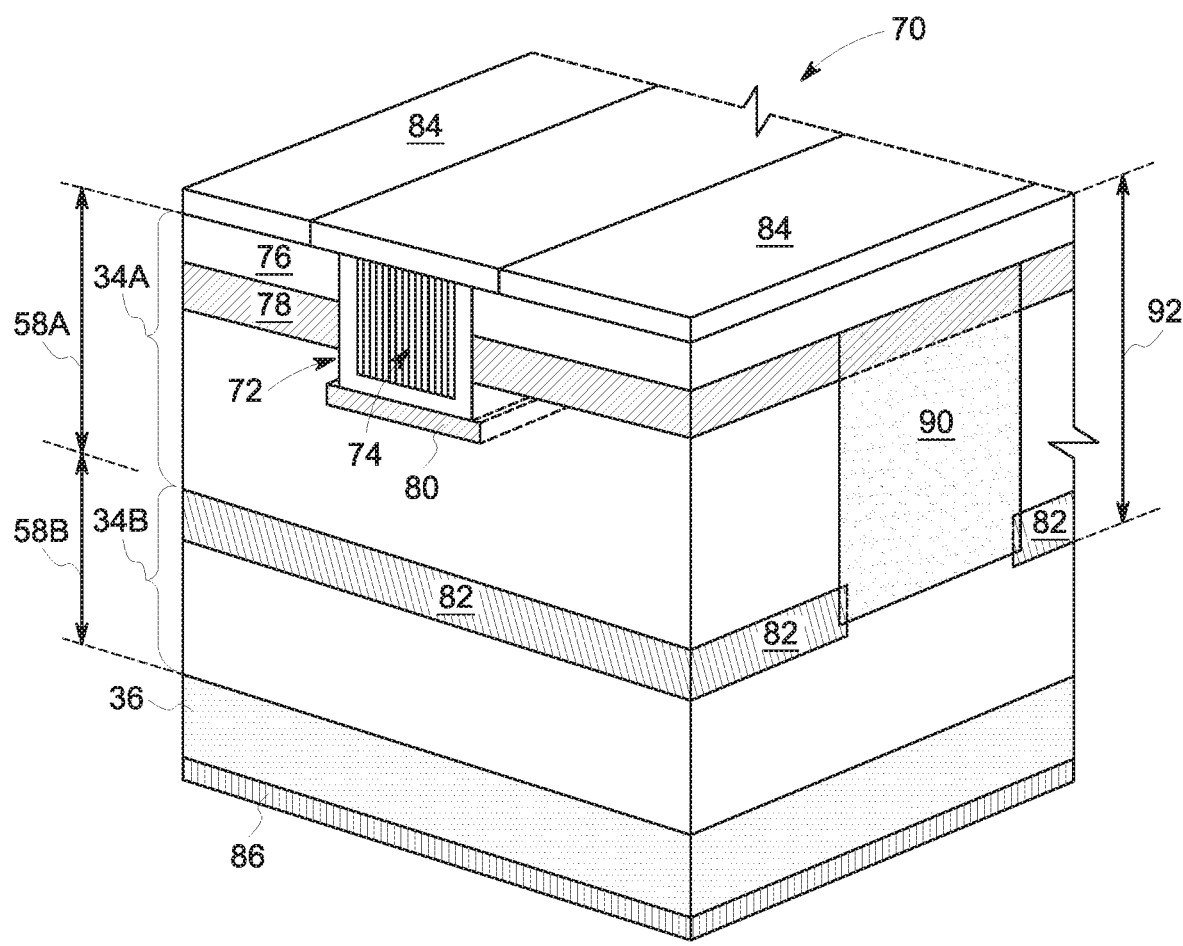
FIG. 2 is a perspective view of an embodiment of a semiconductor device fabricated at least in part using a high-energy implantation process and the SiHEIM, in accordance with embodiments of the present approach.

FIG. 2 is a perspective view of an embodiment of a semiconductor device 70 that is formed, at least in part, using the disclosed SiHEIM during one or more high-energy implantation processes. For the embodiment depicted in FIG. 2, the semiconductor device 70 is, more specifically, a SiC charge balanced (CB) trench metal-oxide-semiconductor field-effect transistor (MOSFET) device. It may be appreciated that, in order to more clearly illustrate certain components of the trench MOSFET device 70, certain commonly understood design elements (e.g., top metallization, passivation, edge termination, and so forth) are omitted.

Like the intermediate device structure 32 of FIG. 1, the illustrated embodiment of the trench MOSFET device 70 of FIG. 2 includes the first or device epi layer 34A disposed directly on a second epi layer 34B, which is, in turn, disposed directly on a substrate layer 36. The first epi layer 34A has an epi doping of a first conductivity type (e.g., n-type) and includes device-specific features of the trench MOSFET device 70. These features include a trench feature 72 having a gate 74 (e.g., a polysilicon gate) disposed within, a source region 76 having the first conductivity type (e.g., n-type), a base region 78 having a second conductivity type (e.g., p-type), and a shield region 80 having the second conductivity type (e.g., p-type).

For the embodiment of the trench MOSFET device 70 illustrated in FIG. 2, the second epi layer 34B is a charge balance (CB) layer having an epi doping of the first conductivity type (e.g., n-type). Additionally, the CB layer 34B includes charge balance (CB) regions 82 having the second conductivity type (e.g., p-type). In other embodiments, the device 70 may include any suitable number of (e.g., 2, 3, 4, 5, or more) CB layers such that the device 70 has a suitable blocking voltage for a particular application. The illustrated SiC trench MOSFET device 70 further includes a source contact 84 disposed on the source region 76 of the device epi layer 34A, and a drain contact 86 disposed directly on a bottom surface of the substrate 36.

The illustrated embodiment of the SiC trench MOSFET device 70 in FIG. 2 also includes a charge balance (CB) bus region 90 that extends between the base region 78 or the shield region 80 in the device epi layer 34A having the second conductivity type and the CB regions 82. It is presently recognized that, when the device 70 transitions from an off-state to on-state, holes are able to flow from the base region 78 to the CB regions 82 via the CB bus region 90. Conversely, during a transition from on-state to off-state, carriers are able to flow from the CB regions 82 to the base region 78 via the CB bus region 90. As a result, the switching performance of the device 70 is generally independent of the recombination-generation rates of the carriers, thereby offering increased switching speeds, as well as reduced switching and dynamic on-resistance losses.

As such, the illustrated CB bus region 90 is one example of a feature that is formed using a high-energy implantation process and the disclosed SiHEIM. That is, the CB bus region 90 extends through the entire thickness 58A of the first epi layer 34A, and partially into the thickness 58B of the second epi layer 34B, to contact the CB regions 82. In other embodiments having multiple CB layers, the CB bus region 90 may also extend through at least a portion of each of the multiple CB layers to contact CB regions 82 of each CB layer. Accordingly, in certain embodiments, the CB bus region 90 may have a depth 92 that is greater than 2 μm (e.g., between 2 μm and 15 μm, between 5 μm and 15 μm, between 5 μm and 10 μm) to contact the CB regions of one or more CB layers, rendering the feature unsuitable for standard implantation energies (e.g., less than 500 keV), which are limited to depths of less than 2 μm (e.g., about 1 μm) in SiC epi layers. While the CB bus region 90 is provided as an example of a high-energy implantation region, it may also be appreciated that, in other embodiments, other features of the device 70 (e.g., the CB regions 82, base region 78, source region 76) may be formed using the disclosed SiHEIM during a high-energy implantation process, as disclosed herein. It should be understood that the CB bus region 90 and/or other regions formed using the high-energy implantation process may have doping concentrations of approximately greater than or equal to $1 \times 10^{14}$ cm$^{-3}$ (e.g., between approximately $5 \times 10^{15}$ cm$^{-3}$ and approximately $1 \times 10^{17}$ cm$^{-3}$).

Figure 3:
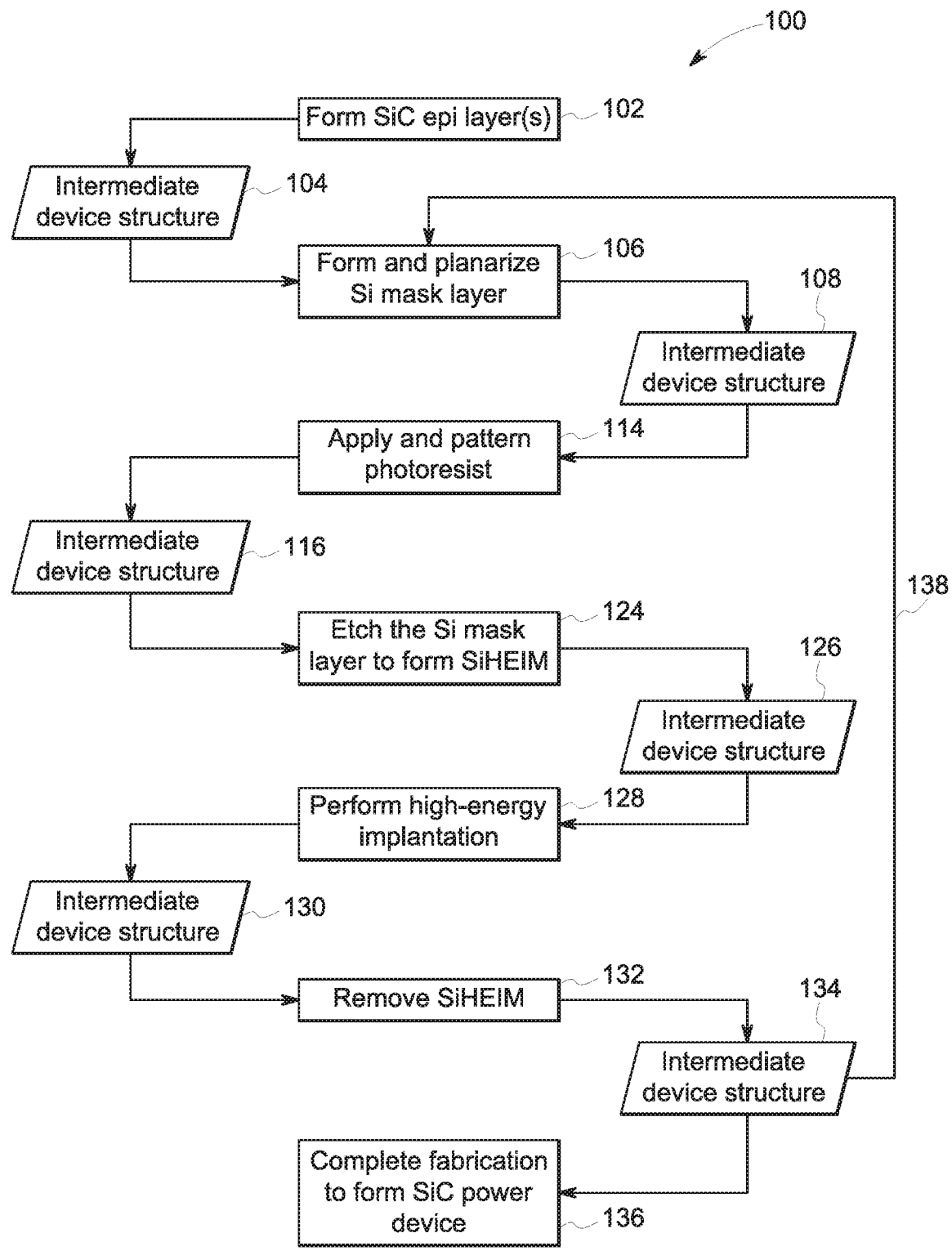
FIG. 3 is a flow diagram of a process for forming a semiconductor power device using an embodiment of the SiHEIM mask during a high-energy implantation process, in accordance with embodiments of the present approach.

FIG. 3 is a flow diagram illustrating an embodiment of a process 100 for forming a SiC power device (e.g., trench MOSFET device 70 of FIG. 2) having at least one high-energy implantation region (e.g., CB bus region 90) that is implanted using the disclosed SiHEIM mask 40 during a high-energy implantation process. It should be noted that the illustrated embodiment of the process 100 is merely provided as an example, and, in other embodiments, the process 100 may include additional steps, repeated steps, or fewer steps, in accordance with the present disclosure. Additionally, FIG. 3 is discussed with reference to FIGS. 4A-F, which are partial cross-sectional views of intermediate device structures that respectively correspond to the output or products of particular steps of the process of FIG. 3. It should be appreciated that the various layers and features illustrated in FIGS. 4A-F are not drawn to scale.

Figure 4A:
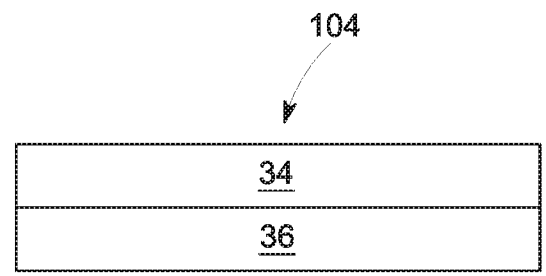
FIGS. 4A, 4B, 4C, 4D, 4E, and 4F are partial cross-sectional views of intermediate device structures corresponding with steps of the process of FIG. 3, in accordance with embodiments of the present approach.

For the illustrated embodiment, the process 100 begins with forming (block 102) one or more SiC epi layers to yield the intermediate device structure 104. In certain embodiments, vapor-phase, liquid-phase, or solid-phase epitaxial growth techniques can be used to grow the SiC epi layers. For example, the SiC epi layer may be grown on top of an underlying layer (e.g., a SiC substrate layer, another SiC epi layer) using chemical vapor deposition (CVD) techniques in an epitaxial growth chamber. Turning briefly to FIG. 4A, the example intermediate device structure 104 includes SiC epi layers 34 grown directly onto the SiC substrate 36. While omitted for simplicity, it may be appreciated that the SiC epi layers 34 may include any suitable number of SiC epi layers (e.g., device layer 34A and one or more CB layers 34B, as illustrated in FIG. 1), and each epi layer may include suitable features for a particular SiC device (e.g., CB regions 82, a shield region 80, a source region 76, a base region 78, as illustrated in FIG. 2).

Figure 4B:
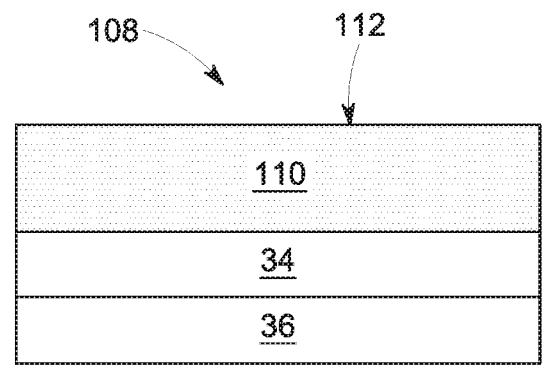

Returning to FIG. 3, the process 100 continues with forming (block 106) a polysilicon mask layer 110 directly on the SiC epi layers 34 formed in block 102, and then planarizing the deposited polysilicon mask layer to yield the intermediate device structure 108. For example, the polysilicon mask layer 110 may be grown on top of the SiC epi layers 34 using chemical vapor deposition (CVD) techniques in an epitaxial growth chamber. In certain embodiments, the polysilicon mask layer 110 is deposited at high temperatures (e.g., above 1000° C., around 1050° C.), such that the polysilicon mask layer 110 is deposited with minimal stress. In some embodiments, chemical-mechanical planarization, or other suitable polarization techniques, are used to planarize (e.g., thin, flatten, and/or smooth) the polysilicon mask layer 110. Turning briefly to FIG. 4B, the example intermediate device structure 108 includes a polysilicon mask layer 110 disposed directly on the SiC epi layers 34, wherein the layer has a substantially flat, uniform top surface 112 after planarization.

Figure 4C:
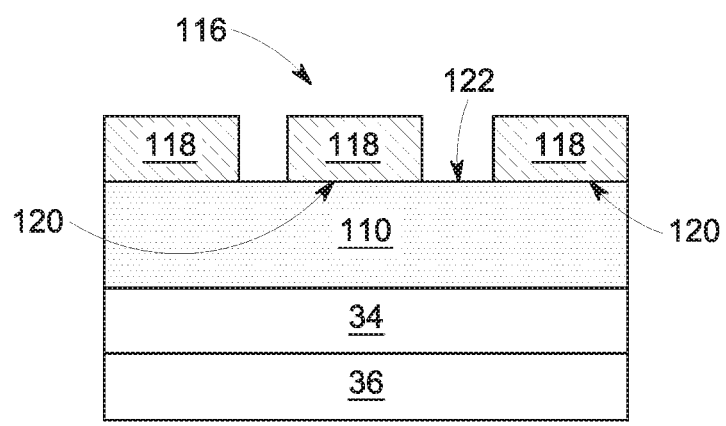

Returning to FIG. 3, the process 100 continues with applying and patterning (block 114) a photoresist layer to form a photoresist mask directly on the polysilicon mask layer 110, yielding the intermediate device structure 116. The photoresist mask may be formed using any suitable photolithographic techniques and/or equipment. For example, in certain embodiments, the photoresist is patterned using an I-line wafer stepper. Turning briefly to FIG. 4C, the example intermediate device structure 108 includes the photoresist mask 118 disposed directly on the polysilicon mask layer 110. More specifically, the surface of the polysilicon mask layer 110 includes masked portions 120 and exposed or unmasked portions 122. In some embodiments, the mask is a silicon oxide layer.

The process 100 of FIG. 3 continues with etching (block 124) the exposed portions 122 of the polysilicon mask layer 110 to form the SiHEIM 40, as illustrated in the intermediate device structure 126. For example, deep reactive ion etching (DRIE) may be used to pattern the SiHEIM 40 in preparation for implantation of the one or more SiC epi layers 34. It may be appreciated that DRIE can penetrate deeply (e.g., 20 μm or more) into the exposed portions 122 of the polysilicon mask layer 110 to form high-aspect ratio features. The photoresist mask 118 protects the masked portions 122 of the polysilicon mask layer 110 from etching, forming high-aspect ratio trench features 46. After etching, the photoresist mask 118 may be gradually removed from the surface of the SiHEIM 40 during etching, while in certain embodiments it may be removed (e.g., dissolved) in a separate process.

Figure 4D:
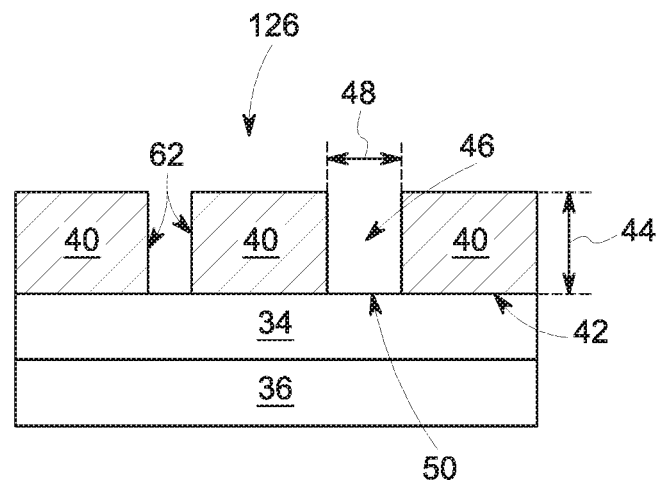

As illustrated in FIG. 4D, the intermediate device structure 126 includes the SiHEIM 40 having high-aspect ratio trench features 46, each having a respective width 48 (e.g., between 1 μm and 10 μm) that is defined by the structure of the photoresist mask 118 illustrated in FIG. 4C. Additionally, as mentioned, the illustrated trench features 46 have a depth that corresponds to the thickness 44 of the SiHEIM 40. As such, after the SiHEIM 40 is patterned, the surface of the SiC epi layer 34A includes masked regions 42 and unmasked or exposed regions 50. As mentioned, the edges 62 of the trench features 46 are substantially vertical (e.g., substantially perpendicular to the epi layers 34 of the intermediate device structure 32).

Figure 4E:
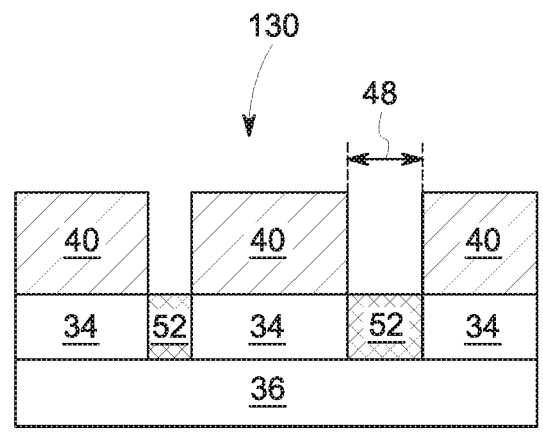

After forming the SiHEIM 40, the process 100 of FIG. 3 continues with performing (block 128) a high-energy implantation process to form the high-energy implanted regions 52 in the surface of the epi layers 34 and yield the intermediate device structure 130. As illustrated in FIG. 4E, the intermediate device structure 130 includes high-energy implanted regions 52. The high-energy implanted regions 52 each have a respective width that is substantially similar to the width 48 of the corresponding high-aspect trench features 46. The high-energy implanted regions 52 each have a depth 56 that, for the illustrated embodiment, extends through an entire thickness 58A of the epi layer 34A and into a portion of the thickness 58B of the epi layer 34B. As mentioned, the trench features 46 of the SiHEIM 40 include substantially vertical edges 62, such that the high-energy implanted regions 52 also include substantially vertical edges 64.

Figure 4F:
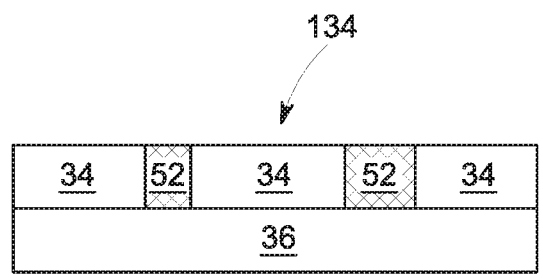

Returning to FIG. 3, the process 100 continues with removing (block 132) the SiHEIM 40 to yield the intermediate device structure 134. For example, in certain embodiments, the SiHEIM 40 may be removed using a dry etching (e.g., DRIE), wet etching, or another suitable technique that cleanly removes the SiHEIM 40 from the surface of the SiC epi layers 34. As illustrated in FIG. 4F, once the SiHEIM 40 is removed, the surface of the SiC epi layers 34 of the intermediate device structure 134 are unmasked or exposed. As indicated by the arrow 138, it may be appreciated that, in certain embodiments, blocks 106, 114, 124, 128, and 132 may be repeated to form a second SiHEIM 40 and perform a second high-energy implantation process to form a second set of high-energy implanted regions (e.g., opposite in conductivity type relative to the high-energy implanted regions 52) in the SiC epi layers 34. After one or more high-energy implantation steps using the SiHEIM 40, the process 100 concludes at block 136 with performing suitable steps (e.g., thermal oxidation, metallization, passivation, edge termination, and so forth) to complete fabrication to yield the SiC device (e.g., the SiC trench MOSFET device 70 of FIG. 2).

Figure 5:
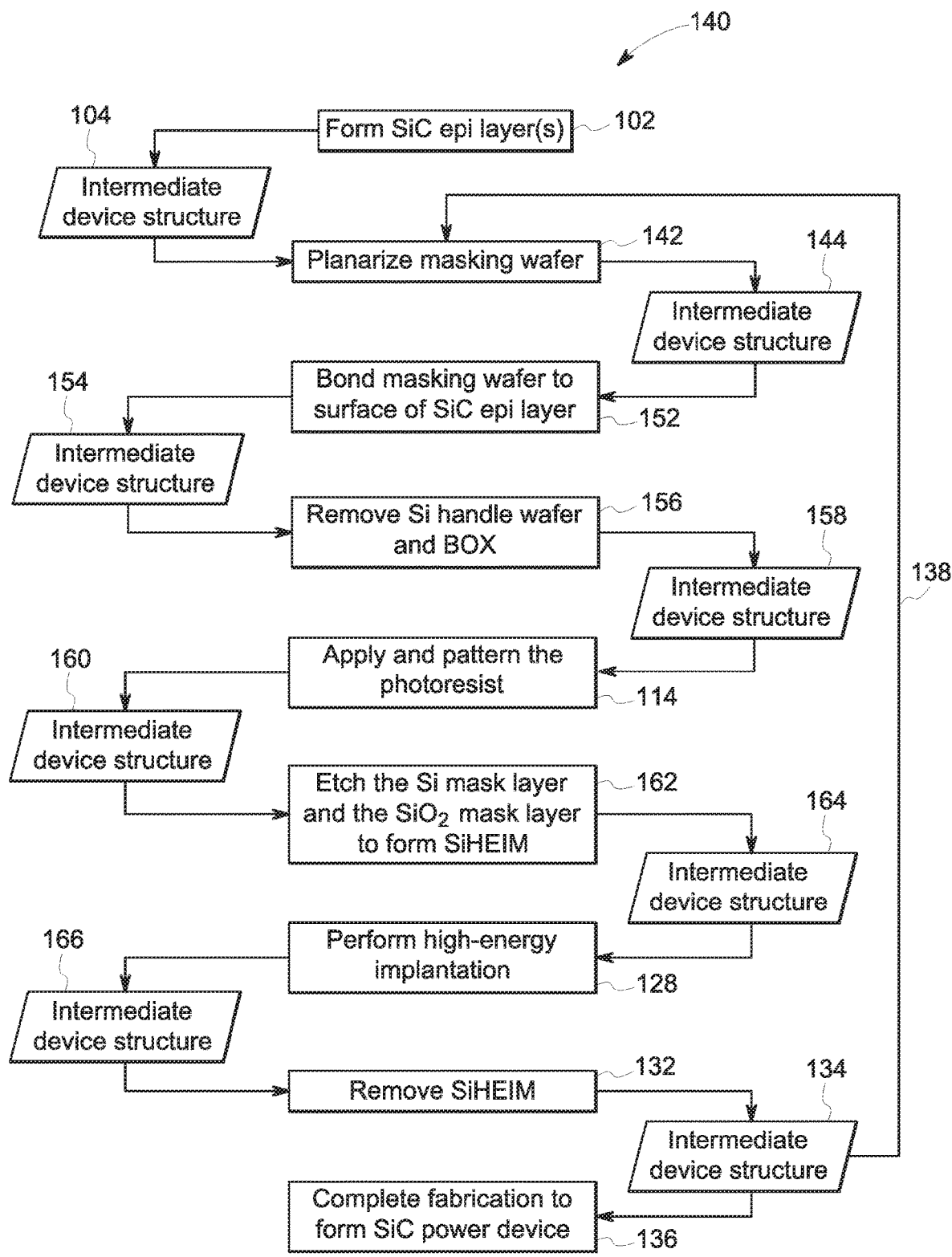
FIG. 5 is a flow diagram of a process for forming a semiconductor power device using another embodiment of the SiHEIM mask during a high-energy implantation process, in accordance with embodiments of the present approach.

FIG. 5 is a flow diagram illustrating an embodiment of an alternative process 140 for forming a SiC power device (e.g., trench MOSFET device 70 of FIG. 2) having at least one high-energy implantation region (e.g., CB bus region 90). More specifically, the process 140 involves using an embodiment of the SiHEIM that is bonded to the surface of the SiC epi layers prior to high-energy implantation. It should be noted that the illustrated embodiment of the process 140 is merely provided as an example, and, in other embodiments, the process 140 may include additional steps, repeated steps, or fewer steps, in accordance with the present disclosure. Additionally, FIG. 5 is discussed with reference to FIGS. 6A-F, as well as FIGS. 4A and 4F, which are partial cross-sectional views of intermediate device structures that respectively correspond to the output or products of particular steps of the process 140 of FIG. 5. It should be appreciated that the various layers and features illustrated in FIGS. 6A-F are not drawn to scale.

Figure 6A:
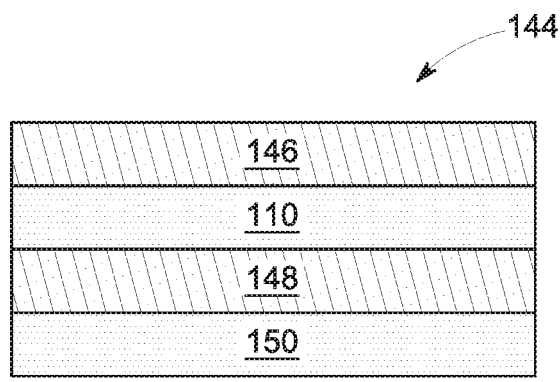
FIGS. 6A, 6B, 6C, 6D, 6E, and 6F are partial cross-sectional views of intermediate device structures corresponding with steps of the process of FIG. 5, in accordance with embodiments of the present approach.

For the illustrated embodiment, the process 140 begins with forming (block 102) one or more SiC epi layers to yield the intermediate device structure 104 illustrated in FIG. 4A, as discussed above with respect to FIG. 3. The process 140 continues with planarizing (block 142) a masking wafer (e.g., a silicon-on-insulator (SOI) wafer) that is separate from the intermediate device structure 104 to prepare the masking wafer for bonding. For example, the masking wafer can be planarized using CMP, or another suitable technique, that yields a substantially accurate and uniform (e.g., flat, smooth) surface to facilitate effective bonding of the two structures. FIG. 6A illustrates an embodiment of an intermediate device structure 144 that is a SOI masking wafer after planarization. More specifically, the planarized masking wafer 144 includes a planarized oxide (e.g., $SiO_2$) layer that is referred to herein as the oxide mask layer 146. The oxide mask layer 146 is disposed directly on a polysilicon mask layer 110. The polysilicon mask layer 110 is disposed directly on a thinner, buried oxide (BOX) layer 148, which is, in turn, disposed directly on a silicon handle wafer 150. It should be noted that, in certain embodiments, the oxide mask layer 146 may be completely removed during planarization to instead expose the polysilicon mask layer 110 for direct bonding.

Figure 6B:
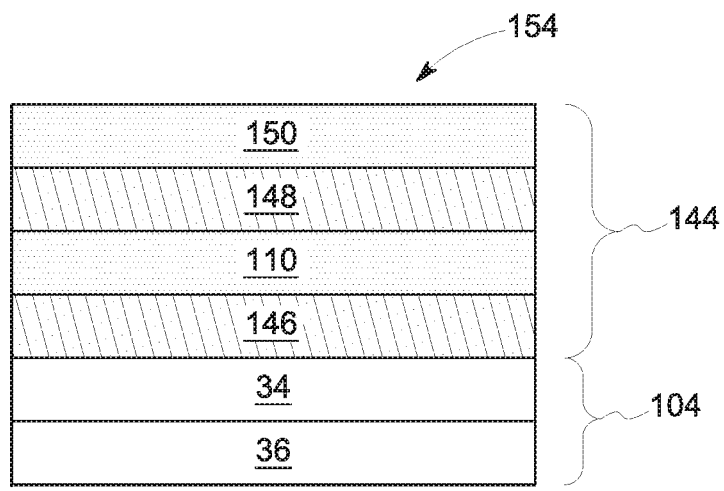

Returning to FIG. 5, the illustrated embodiment of the process 140 continues with bonding (block 152) the masking wafer 144 (as illustrated in FIG. 6A) to the surface of the one or more epi layers of the intermediate device structure 104 (as illustrated in FIG. 6A) to yield the intermediate device structure 154 (as illustrated in FIG. 6B). More specifically, the masking wafer 144 is rotated 180° (e.g., flipped over), such that the oxide mask layer 146 (or the polysilicon mask layer 110) is disposed directly on the SiC epi layers 34. Then, the intermediate device structure 154 is heated to a suitable temperature (e.g., annealed between 600° C. and 1000° C.) to bond the oxide mask layer 146 (or the polysilicon mask layer 110) directly onto the surface of the SiC epi layers 34.

Figure 6C:
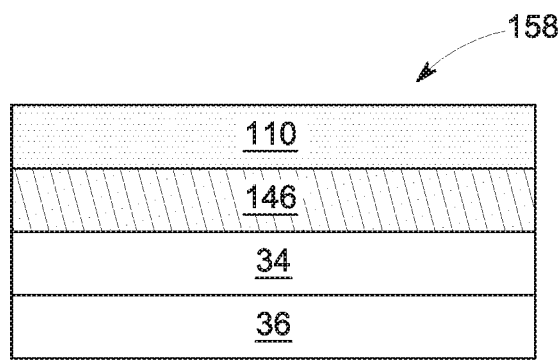
Figure 6D:
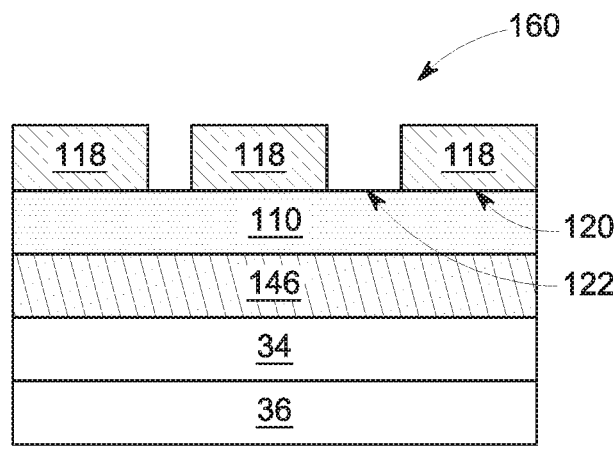

The illustrated embodiment of the process 140 of FIG. 5 continues with removing (block 156) the silicon handle wafer 150 and the BOX layer 148 to form the intermediate device structure 158. For example, silicon handle wafer 150 and the BOX layer 148 may be removed using CMP, etching, and/or other suitable techniques, in accordance with the present disclosure. FIG. 6C illustrates the intermediate device structure 158, which is similar to the intermediate device structure 108 of FIG. 4B, except that the intermediate device structure 158 includes the oxide mask layer 146.

Figure 6E:
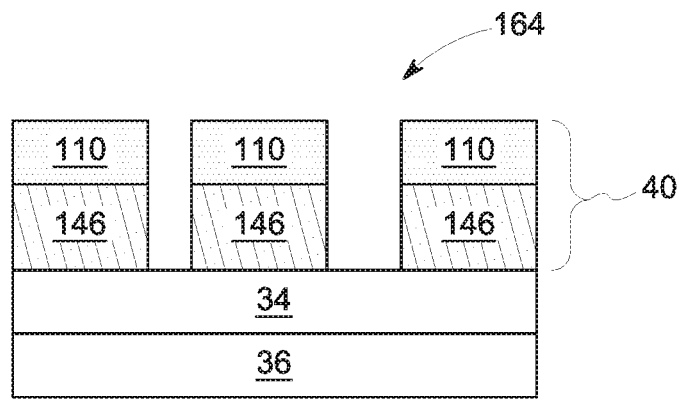
Figure 6F:
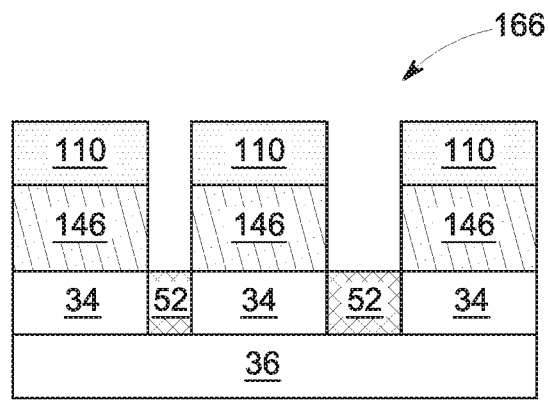

The remainder of the process 140 is substantially similar to the process 100 of FIG. 3. That is, the process 140 continues with applying and patterning (block 114) a photoresist layer on the surface of the polysilicon mask layer 110, as discussed above with respect to FIG. 3, which yields the intermediate device structure 160. Accordingly, the SiC epi layers 34 of the intermediate device structure 160 illustrated in FIG. 6D includes masked regions 120 and exposed or unmasked regions 122. Returning to FIG. 5, the exposed regions 122 of both the polysilicon mask layer 110 and the oxide mask layer 146 are etched (block 162) to yield the intermediate device structure 164. As illustrated in FIG. 6E, the intermediate device structure 164 includes an embodiment of a two-layer SiHEIM 40 formed from portions of the polysilicon mask layer 110 and the oxide mask layer 146.

Returning to FIG. 5, the process 140 continues with performing (block 128) a high-energy implantation process to form the high-energy implanted regions 52 in the epi layers 34 to yield the intermediate device structure 130. As illustrated in FIG. 6E, the intermediate device structure 166 includes the high-energy implanted regions 52 disposed in the SiC epi layers 34. The process 140 of FIG. 5 continues with removing (block 132) the SiHEIM 40 to yield the intermediate device structure 134 illustrated in FIG. 4F. As mentioned, in certain embodiments, the process may be partially repeated, as indicated by the arrow 138, to perform additional high-energy implantation processes.

It may be appreciated that, unlike non-semiconductor masking materials (e.g., organic masks, metal masks), the SiHEIM 40 may be described as also being doped by the high-energy implantation process. Additionally, in certain embodiments, the SiHEIM 40 is also doped prior to the high-energy implantation process of block 128 to render the SiHEIM 40 conductive, which can reduce issues with charging of the intermediate device structures 130 or 164 during implantation. That is, it is presently recognized that that certain high-energy implantation processes can experience issues when the intermediate device structure accumulates charge during implantation. Certain high-energy implantation systems 10 use various techniques, such as flood guns, to mitigate such charging problems. However, it is presently recognized that, doping the SiHEIM 40 to a sufficient level to be conductive substantially reduces this charging effect during implantation.

As such, in certain embodiments, the SiHEIM 40 may have the first conductivity type (e.g., n-type) or the second conductivity type (e.g., p-type). For example, in certain embodiments, the SiHEIM 40 may be doped as it is formed (e.g., during a CVD growth process), or may be doped after formation (e.g., doping the polysilicon mask layer 110 of the intermediate device structure 108 of FIG. 4B or the intermediate device structure 158 of FIG. 6C). In certain embodiments, the SiHEIM 40 may have a doping between $1\times10^{16}$ per cubed centimeter ($cm^{-3}$) and $1\times10^{20}$ $cm^{-3}$ of the first or second conductivity type. In certain embodiments in which the SiHEIM 40 is doped, the SiHEIM 40 may specifically be doped using different dopant species than are used to form the high-energy implanted regions 52.

Technical effects of this disclosure include embodiments of a silicon high-energy implantation mask (SiHEIM) for use in high-energy implantation operations of SiC epi layers. The disclosed SiHEIM can be controllably formed to suitable thickness, is substantially stable (e.g., thermally stable, chemically stable) to the conditions of a high-energy implantation processes, has similar thermal expansion properties relative SiC epi layers, and can be reliably patterned into well-defined, high-aspect features (e.g., trench features having substantially vertical sidewalls). As such, the disclosed SiHEIM enables the implantation of high-energy implanted regions that can extend deeply (e.g., greater than 1 μm, between 2 μm and 15 μm, between 5 μm and 10 μm) into underlying SiC epi layers and have well-defined features (e.g., edges that are perpendicular to the surface of the SiC epi layers). Furthermore, the disclosed SiHEIM addresses and overcomes limitations associated with the use of organic (soft) masks and metal (hard) masks in high-energy implantation processes.

This written description uses examples, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An intermediate semiconductor device structure, comprising:
a SiC substrate layer having a first conductivity type;
a silicon carbide (SiC) epitaxial (epi) layer having the first conductivity type disposed on the SiC substrate layer; and
a silicon high-energy implantation mask (SiHEIM) formed directly on a first portion of the SiC epi layer and having a thickness between 5 micrometers (μm) and 20 μm, wherein the SiHEIM is configured to block implantation of the first portion of the SiC epi layer during a high-energy implantation process of a second conductivity type having an implantation energy between greater than 500 kiloelectron volts (keV), and wherein the SiHEIM is a polysilicon layer that has an epitaxial doping concentration of the first conductivity type between $1\times10^{16}$ per cubed centimeter ($cm^{-3}$) and $1\times10^{20}$ $cm^{-3}$ and is electrically conductive such that the SiHEIM blocks charging of the intermediate semiconductor device structure throughout the high-energy implantation process.

2. The intermediate device structure of claim 1, wherein the implantation energy of the high-energy implantation process is between 10 megaelectron volts (MeV) and 50 MeV and the SiHEIM is configured to block implantation of ions of the second conductivity type during the high-energy implantation process.

3. The intermediate device structure of claim 1, wherein the SiHEIM includes a trench feature defined directly above a second portion of the SiC epi layer, wherein the trench feature is configured to expose the second portion of the SiC epi layer to implantation during the high-energy implantation process.

4. The intermediate device structure of claim 3, wherein the trench feature has a respective trench depth between 1 μm and 20 μm, a respective trench width between 1 μm and 10 μm, and an aspect ratio between 1:2 and 1:20.

5. The intermediate device structure of claim 3, wherein the first portion of the SiC epi layer includes a high-energy implanted region having the first conductivity type disposed adjacent to the second portion of the SiC epi layer, and wherein the SiHEIM is configured to selectively allow implantation of the second portion of the SiC epi layer with ions of the second conductivity type during the high-energy implantation process.

6. The intermediate device structure of claim 3, wherein each of the plurality of trench features include respective side walls that are perpendicular to an upper surface of the SiC epi layer.

7. The intermediate device structure of claim 1, wherein the SiHEIM consists essentially of silicon.

8. The intermediate device structure of claim 1, comprising a high-energy implanted region having a second conductivity type disposed in a second portion of the SiC epi layer exposed by the SiHEIM, wherein the high-energy implanted region has a depth between 2 μm and 15 μm.

9. The intermediate device structure of claim 8, wherein the SiHEIM has the second conductivity type as a result of the high-energy implantation process that formed the high-energy implanted region.

10. The intermediate device structure of claim 8, wherein the SiC epi layer is a super-junction (SJ) layer.

11. The intermediate device structure of claim 8, wherein the high-energy implanted region has a depth between 5 μm and 10 μm.

12. The intermediate device structure of claim 11, comprising a second high-energy implanted region having a first conductivity type disposed in the first portion of the SiC epi layer, wherein the second high-energy implanted region has a depth between 2 μm and 15 μm.

13. The intermediate device structure of claim 12, wherein the second high-energy implanted region has a depth between 5 μm and 10 μm.

14. The intermediate device structure of claim 12, wherein the SiC epi layer is a charge balance (CB) layer and the high-energy implanted region and the second high-energy implanted region are CB regions of the CB layer.

15. The intermediate device structure of claim 1, wherein at least a portion of the intermediate device structure comprises a doping concentration between approximately $5 \times 10^{15}$ cm$^{-3}$ and approximately $1 \times 10^{17}$ cm$^{-3}$.

16. The intermediate device structure of claim 1, wherein the intermediate semiconductor device structure is configured to yield formation of a metal-oxide-semiconductor field-effect transistor (MOSFET), a junction field effect transistor (JFET), a bipolar junction transistor (BJTs), or a diode.

* * * * *